(12) United States Patent
Tanaka et al.

(10) Patent No.: US 10,096,156 B2
(45) Date of Patent: Oct. 9, 2018

(54) COMPUTER-READABLE RECORDING MEDIUM, VOXELIZATION METHOD, AND INFORMATION PROCESSING DEVICE FOR AUTOMATIC VOXELIZATION OF 3D SHAPES

(71) Applicant: FUJITSU LIMITED, Kawasaki-shi, Kanagawa (JP)

(72) Inventors: Hiroshi Tanaka, Atsugi (JP); Guoping Sun, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/619,612

(22) Filed: Jun. 12, 2017

(65) Prior Publication Data

US 2018/0012404 A1 Jan. 11, 2018

(30) Foreign Application Priority Data

Jul. 8, 2016 (JP) ................. 2016-136423

(51) Int. Cl.
| | |
|---|---|
| G06T 17/20 | (2006.01) |
| G06T 19/20 | (2011.01) |
| G06T 17/00 | (2006.01) |
| G06F 17/50 | (2006.01) |

(52) U.S. Cl.
CPC ............ *G06T 17/20* (2013.01); *G06F 17/50* (2013.01); *G06T 17/00* (2013.01); *G06T 19/20* (2013.01);
(Continued)

(58) Field of Classification Search
CPC ...... G06T 17/20; G06T 19/20; G06F 17/5009
See application file for complete search history.

(56) References Cited

U.S. PATENT DOCUMENTS

| | | | | |
|---|---|---|---|---|
| 2006/0290695 A1* | 12/2006 | Salomie | ................. | G06T 17/20 345/420 |
| 2007/0291032 A1* | 12/2007 | Hashima | ................. | G06T 19/00 345/424 |

(Continued)

FOREIGN PATENT DOCUMENTS

| | | |
|---|---|---|
| DE | 10360150 A1 | 7/2005 |
| JP | 11-039512 | 2/1999 |
| JP | 2006-277672 | 10/2006 |
| JP | 2008-292414 | 12/2008 |

OTHER PUBLICATIONS

Machine Translation to English for DE 10360150.*

(Continued)

*Primary Examiner* — Barry Drennan
*Assistant Examiner* — Terrell Robinson
(74) *Attorney, Agent, or Firm* — Fujitsu Patent Center

(57) ABSTRACT

A non-transitory computer-readable recording medium stores a voxelization program that causes a computer to execute a process. The process includes voxelizing a three-dimensional shape to generate a first voxel structure corresponding to the three-dimensional shape, specifying, in a case where lines perpendicular to respective faces of a cube or a cuboid containing the generated first voxel structure are extended from the respective faces toward inside the cube or the cuboid until the lines hit the first voxel structure, a region outside an outer periphery of the first voxel structure according to whether at least lines extended from three faces orthogonal to each other intersect, and setting the specified outside region as a second voxel structure, and performing inversion to invert a region of the voxel structures and a region not set as a voxel in the cube or the cuboid.

6 Claims, 21 Drawing Sheets

(52) U.S. Cl.
CPC ...... *G06F 17/5009* (2013.01); *G06T 2200/04* (2013.01)

(56) References Cited

U.S. PATENT DOCUMENTS

2013/0330685 A1* 12/2013 Lahelma ............... A61B 6/14
433/29
2015/0130804 A1* 5/2015 Hatanaka ............ G06T 19/20
345/424

OTHER PUBLICATIONS

Tiwari, Santosh et al., "An envelope generation algorithm for packing and layout applications", International Journal on Interactive Design and Manufacturing (IJIDEM), Springer Paris, Paris, vol. 8, No. 3, 2014, pp. 171-185, XP009502315, Retrieved from the Internet: URL:https://epo.summon.serialssolutions.com/#!/search?bookMark=
ePnHCXMwdV1Nb8MgDI2mHvb1GybOIZASHLIweLpN-wG9WwSc7JAIUdUe-u9rQ1rtshuHZ2Qhg3k8MM_
FhnkrFauAmF6pZY29qiUnlEbbBxF6rdWSfTf3dgWP6woqv0GUT-8XHbllOpZszpIZUhFI8VX4cZibOP7-Kt3WKmaWcKSvm3Wr0l_
I8Un-I31d2h7ncS3H4-jzsv_
X6w4AcWvaEd5Yxlh0BGDsHFzgZg2sqql0TbAgtgG-MD5aMKfsYuveyN-
DldV30DkhkDb7IbrnU1RwmJ09EHSEIbWyntxYBtBtxUVlxy-EQnlocFtjGhlsEZAHhsHmH3DGJZNdDigxwCX2cAWaVGkN,
[retrieved on Apr. 2014].
Extended European Search Report dated Jan. 16, 2018 for corresponding European Patent Application No. 17177359.1, 7 pages.

* cited by examiner

FIG.4
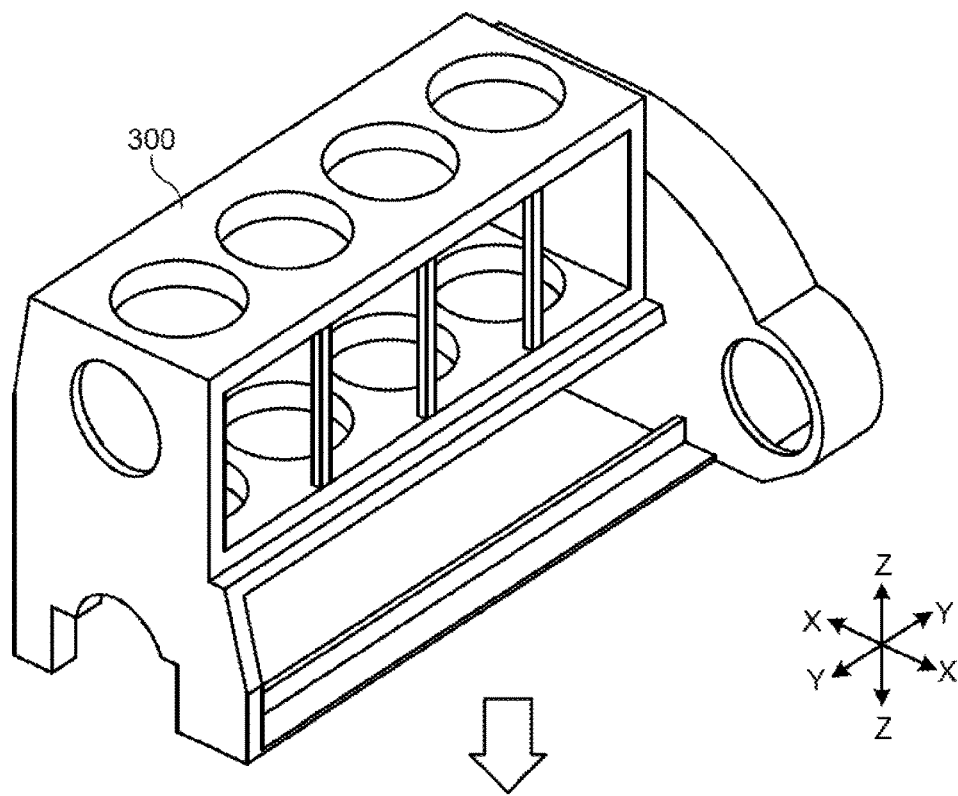
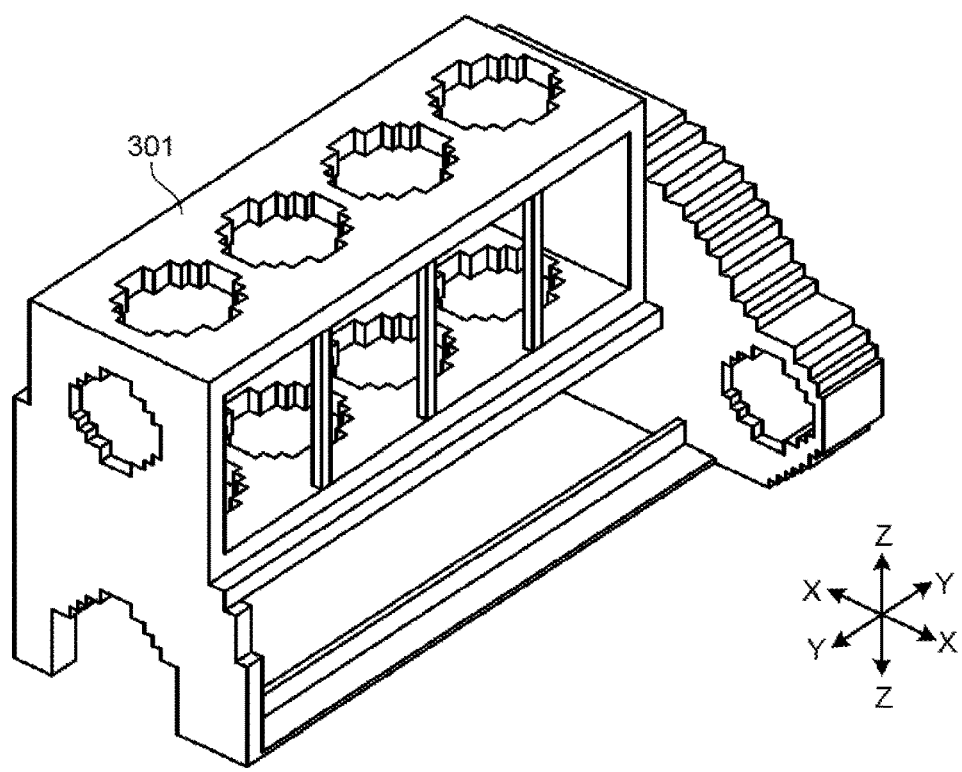

FIG.6A
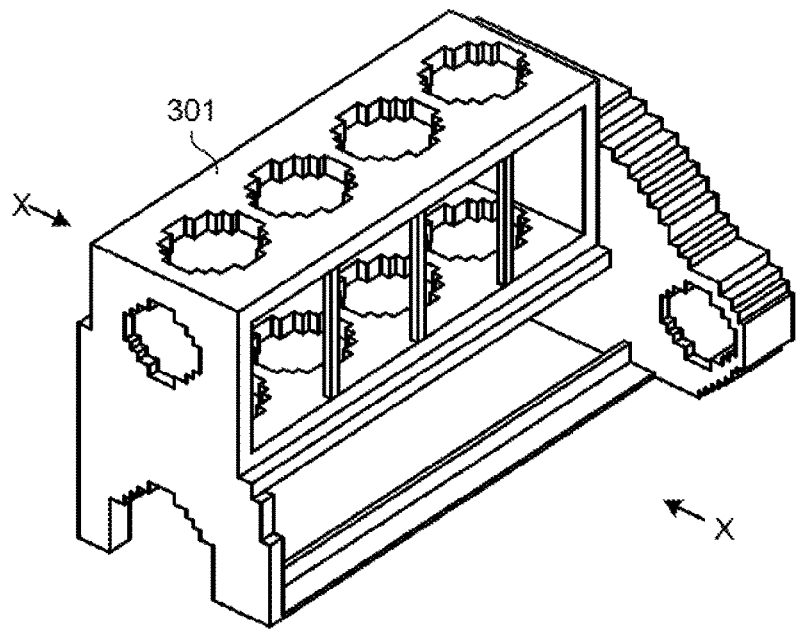
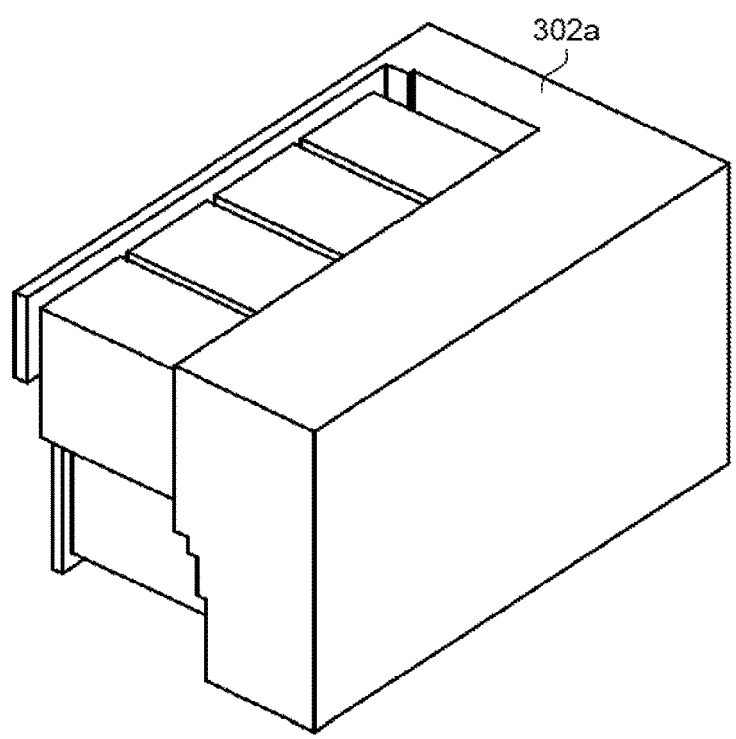
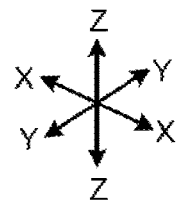

FIG.6B
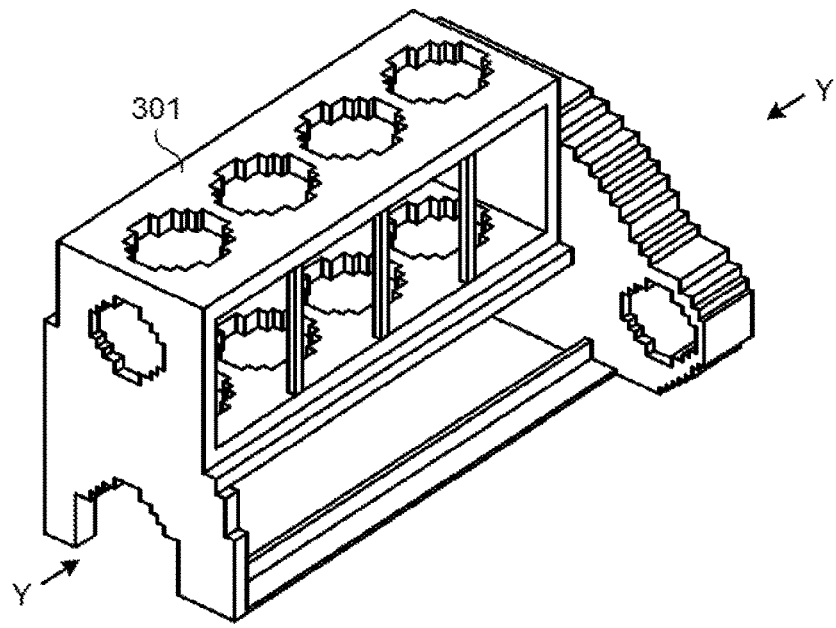
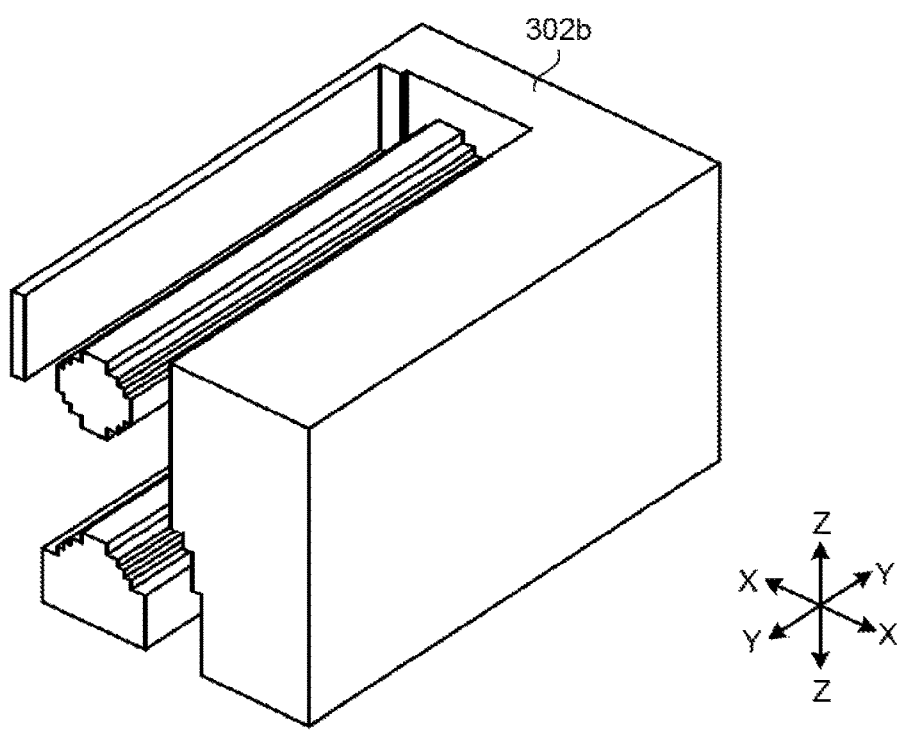

FIG.6C
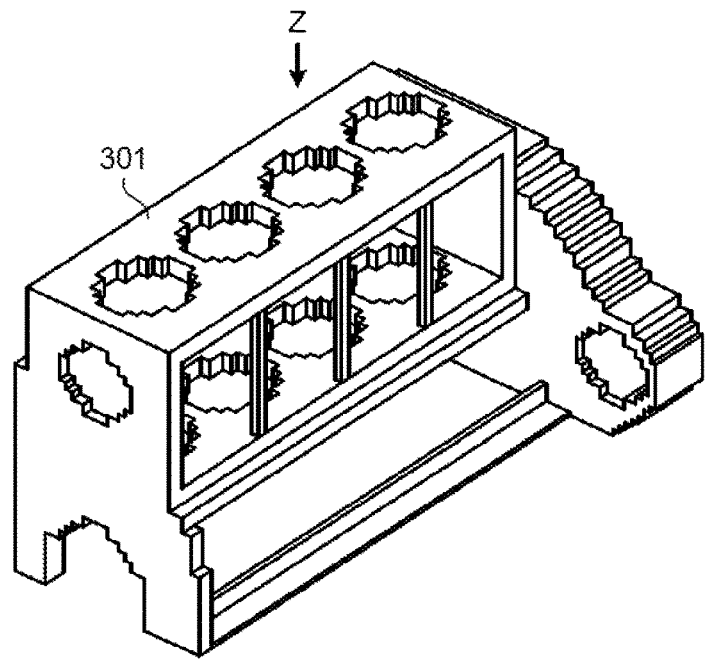
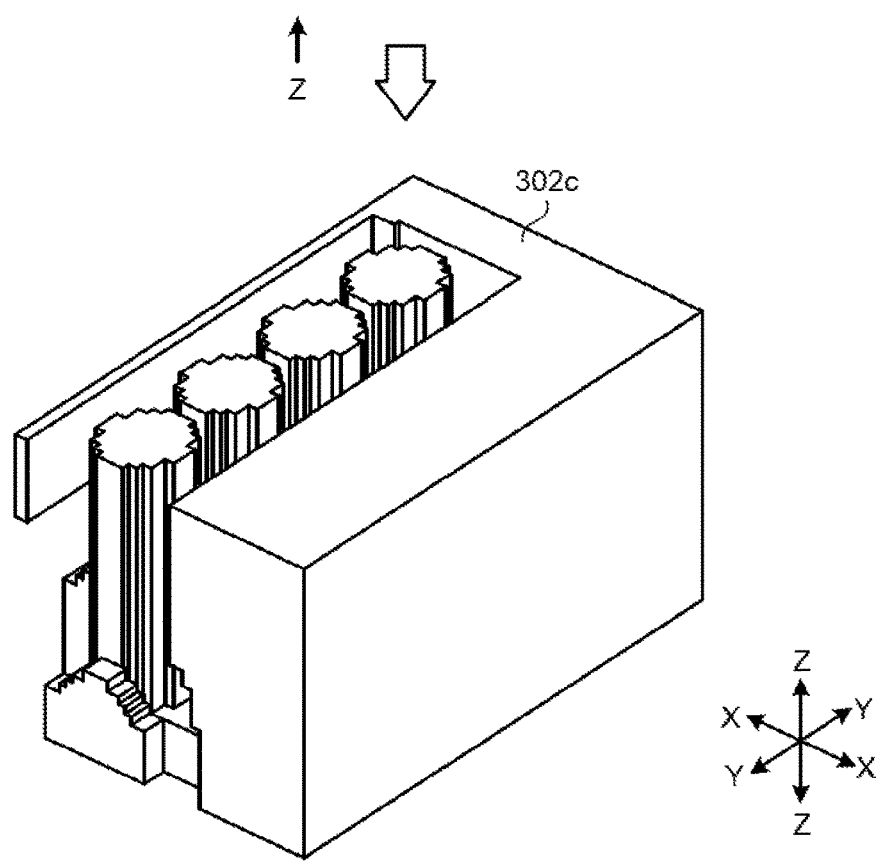

FIG.10
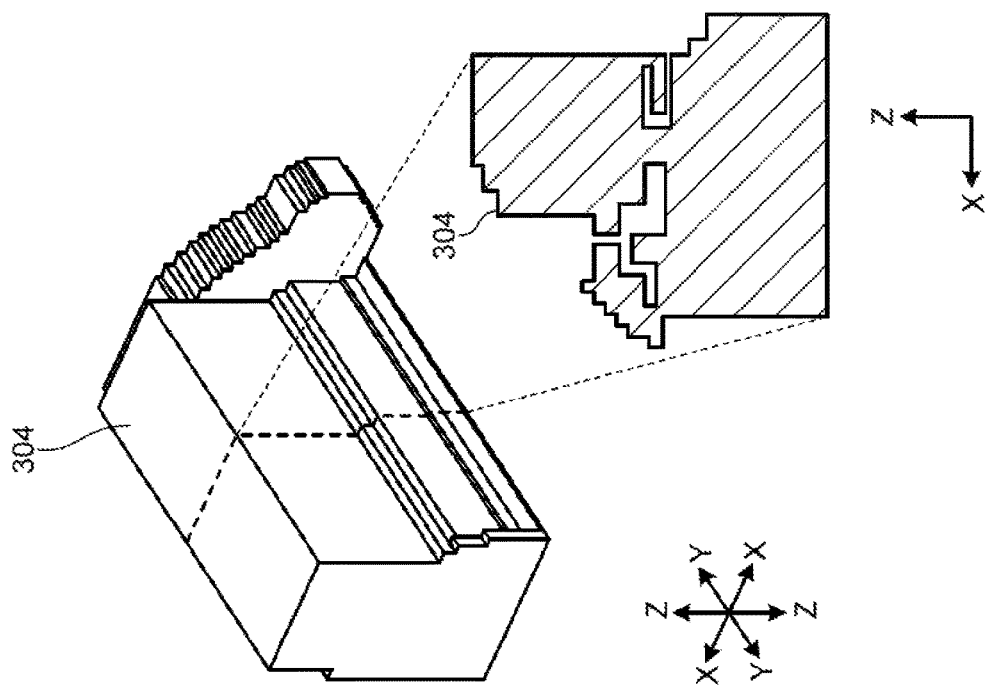
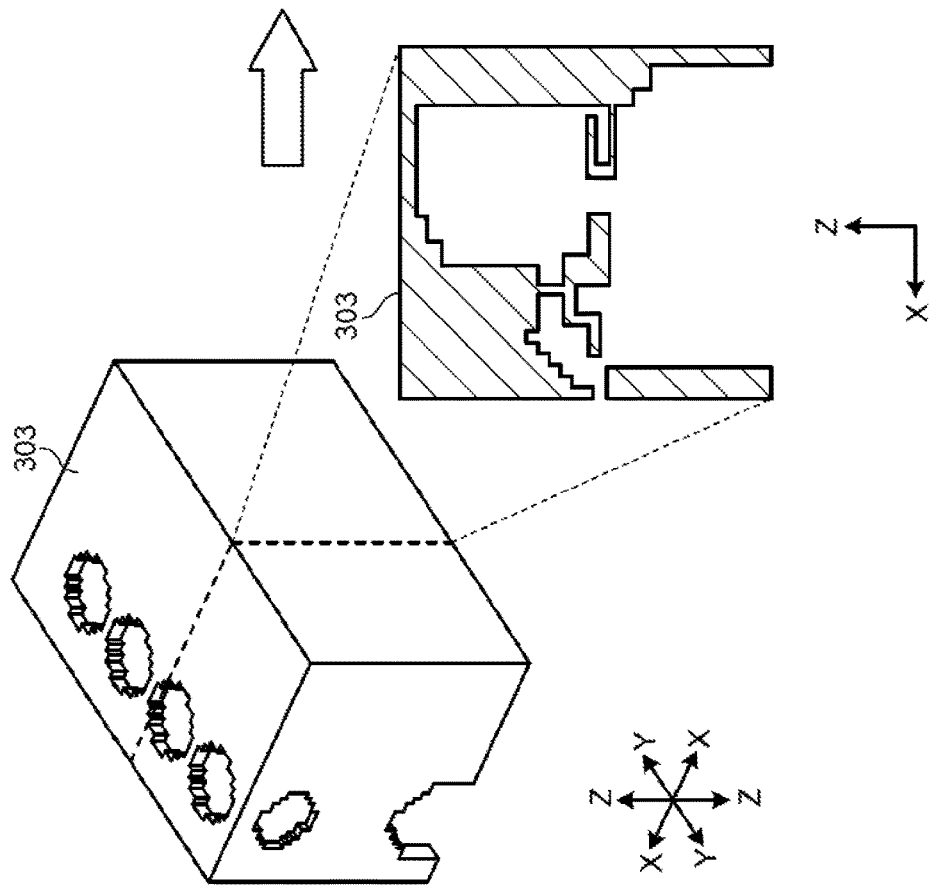

COMPUTER-READABLE RECORDING MEDIUM, VOXELIZATION METHOD, AND INFORMATION PROCESSING DEVICE FOR AUTOMATIC VOXELIZATION OF 3D SHAPES

CROSS-REFERENCE TO RELATED APPLICATION

This application is based upon and claims the benefit of priority of the prior Japanese Patent Application No. 2016-136423, filed on Jul. 8, 2016, the entire contents of which are incorporated herein by reference.

FIELD

The embodiment discussed herein is related to a computer-readable recording medium, a voxelization method, and an information processing device.

BACKGROUND

Computer Aided Engineering (CAE) is known as an example of techniques that enable to support a preliminary study on designing and manufacturing of products and process designing using computer technology. In the CAE field, a simulation is performed based on shape data of a three-dimensional shape of a product being a designing target such as an automobile to enable an assembly process or the like to be examined at a designing step of the target product.

Patent Document 1: Japanese Laid-open Patent Publication No. 2006-277672

SUMMARY

According to an aspect of an embodiment, a non-transitory computer-readable recording medium stores a voxelization program that causes a computer to execute a process. The process includes voxelizing a three-dimensional shape to generate a first voxel structure corresponding to the three-dimensional shape, specifying, in a case where lines perpendicular to respective faces of a cube or a cuboid containing the generated first voxel structure are extended from the respective faces toward inside the cube or the cuboid until the lines hit the first voxel structure, a region outside an outer periphery of the first voxel structure according to whether at least lines extended from three faces orthogonal to each other intersect, and setting the specified outside region as a second voxel structure, and performing inversion to invert a region of the voxel structures and a region not set as a voxel in the cube or the cuboid.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is an explanatory diagram for explaining voxelization of a three-dimensional shape;

FIG. 6A is an explanatory diagram for explaining processing of filling an outer periphery in an X direction with voxels;

FIG. 6B is an explanatory diagram for explaining processing of filling an outer periphery in a Y direction with voxels;

FIG. 6C is an explanatory diagram for explaining processing of filling an outer periphery in a Z direction with voxels;

FIG. 10 is an explanatory diagram for explaining inverse voxelization;

DESCRIPTION OF EMBODIMENTS

Figure 1:
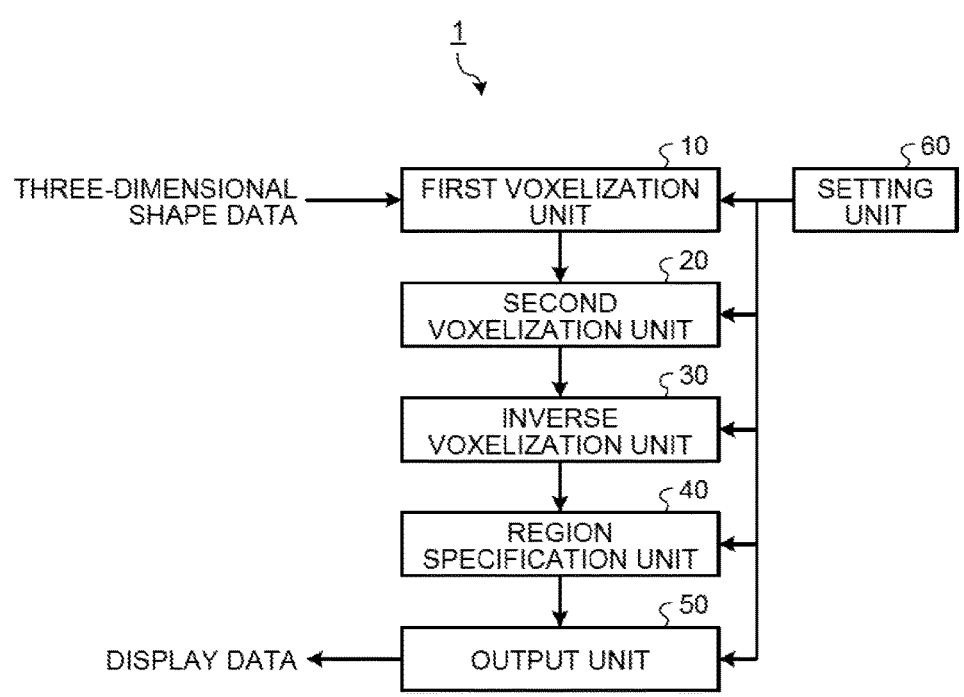
FIG. 1 is a block diagram illustrating a functional configuration example of an information processing device according to an embodiment.

Preferred embodiments of the present invention will be explained with reference to accompanying drawings. In the following embodiments, constituent elements having like functions are denoted with like reference characters and redundant explanations thereof will be omitted. The voxelization program, the voxelization method, and the information processing device described in the following embodiments are only examples, and do not limit the embodiments. Further, respective embodiments described below can be combined with one another within a range where no contradiction occurs.

In the conventional technique, a processing load may be increased when extracting a free space in a product being a designing target from shape data of a three-dimensional shape.

For example, in an automobile manufacturing scene, manufacturing of a product to be incorporated in a free space of a product to be manufactured may be outsourced to another company. When the outsourcing to another company is to be achieved, data indicating the shape of the free space in the product to be manufactured is extracted and provided to the outsourced company. However, in a product such as an automobile, the sizes of face elements indicating the three-dimensional shape of the product are finely divided and the number of elements is large. Therefore, extraction of the data indicating the shape of the free space imposes a large processing load.

Accordingly, it is an object in one aspect of an embodiment of the invention to provide a voxelization program, a voxelization method, and an information processing device capable of easily performing extraction of a free space from a three-dimensional shape.

FIG. 1 is a block diagram illustrating a functional configuration example of an information processing device according to an embodiment. For example, a personal computer (PC) can be applied to an information processing device 1 illustrated in FIG. 1. The information processing device 1 receives three-dimensional shape data of a product created by a three-dimensional Computer Aided design (CAD) on a computer, for example. The information processing device 1 performs processing such as extraction of a free space in the product based on the received three-dimensional shape data and outputs a processing result to a display or the like.

The three-dimensional shape data is data indicating shapes of respective components constituting a product and a Boundary REPresentation (BREP), a facet, or the like can be applied thereto. The BREP represents the three-dimensional shape of a product with phase information (such as Body, Face, Loop, CoEdge, Edge, or Vertex) and geometric information (such as Base Surface, Base Curve, or Base Point). The facet represents the three-dimensional shape of a product with a group of minute triangles (such as Body, Face, or Triangles).

As illustrated in FIG. 1, the information processing device 1 includes a first voxelization unit 10, a second voxelization unit 20, an inverse voxelization unit 30, a region specification unit 40, an output unit 50, and a setting unit 60.

The first voxelization unit 10 voxelizes a three-dimensional shape of a product indicated by three-dimensional shape data of the product to generate a voxel structure (first voxel structure) corresponding to the three-dimensional shape.

A voxel structure represents a three-dimensional shape with a group of minute solids (grids) in an XYZ space. Because a voxel structure can thus represent a three-dimensional shape simply according to presence or absence of a minute solid in an XYZ space, a processing load associated with various types of computing can be suppressed as compared to a case of using three-dimensional shape data such as the BREP or the facet.

The second voxelization unit 20 specifies a region outside the outer periphery of the voxel structure generated by the first voxelization unit 10 and generates a voxel structure (second voxel structure) corresponding to the specified outside region.

Specifically, the second voxelization unit 20 extends lines toward inside a cube or a cuboid containing (enclosing) the first voxel structure generated by the first voxelization unit 10 until the lines hit the first voxel structure. Next, the second voxelization unit 20 specifies a region outside the outer periphery of the first voxel structure generated by the first voxelization unit 10 according to whether at least lines extended from three faces orthogonal to each other intersect.

In other words, the second voxelization unit 20 specifies, in a region (a cube or a cuboid, for example) of a specific three-dimensional space containing the first voxel structure generated by the first voxelization unit 10, a region in which no voxel is set continuously from the outer periphery of the region of the specific three-dimensional space in each of three axis directions. The second voxelization unit 20 then specifies a common region common to the specified regions, that is, a region located outside the outer periphery of the first voxel structure.

In other words, the second voxelization unit 20 specifies, in the region of the specific three-dimensional space containing the first voxel structure generated by the first voxelization unit 10, a region in which three vectors can be formed such that the first voxel structure is not present on extended lines of the three vectors, and the three vectors share a starting point and are orthogonal to each other. That is, the second voxelization unit 20 specifies a region outside the outer periphery of the first voxel structure.

Next, the second voxelization unit 20 generates a second voxel structure corresponding to the specified outside region. That is, the second voxelization unit 20 fills a free space located outside the outer periphery of the first voxel structure corresponding to the three-dimensional shape with voxels.

The inverse voxelization unit 30 performs inverse voxelization on a specific three-dimensional space (a cube or a cuboid, for example) enclosing the first voxel structure corresponding to the three-dimensional shape. That is, the inverse voxelization unit 30 performs inversion to invert a region in which there is a voxel to be a region in which there is no voxel, and invert a region in which there is no voxel to be a region in which there is a voxel in the specific three-dimensional space. With this inverse voxelization, a free space in the three-dimensional shape, which is enclosed by the first voxel structure corresponding to the three-dimensional shape, is voxelized.

The region specification unit 40 specifies a region through which a sphere or cube of a specific size can continuously pass in the region set as the voxels resulting from the inversion by the inverse voxelization unit 30. This divides the region voxelized in the inversion by the inverse voxelization unit 30, that is, the free space in the three-dimensional shape into regions through which the sphere or cube of the specific size can continuously pass. For example, in the free space in the three-dimensional shape, two regions that are connected to each other with a smaller clearance than the sphere or cube of the specific size are divided as two division regions.

The output unit 50 outputs a processing result of the region voxelized by the inverse voxelization unit 30 and specified by the region specification unit 40, that is, a voxel structure corresponding to the free space in the three-dimensional shape indicated by the three-dimensional shape data. As one example, the output unit 50 outputs display data for performing display of the voxel structure. This enables a user to confirm the shape of the free space in the product indicated by the three-dimensional shape data as the voxel structure.

The setting unit 60 is a user interface that receives various settings from the user. For example, the setting unit 60 performs the various settings by displaying a graphical user interface (GUI) on a display and receiving an operation by the user through the GUI. As one example, the setting unit 60 receives settings associated with extraction of a free space in a product, such as a setting at the time of voxelization performed in the first voxelization unit 10, the second voxelization unit 20, and the inverse voxelization unit 30 and a setting at the time of region specification performed in the region specification unit 40. The setting unit 60 also receives a display setting such as a setting on display data to be output by the output unit 50.

Figure 2:
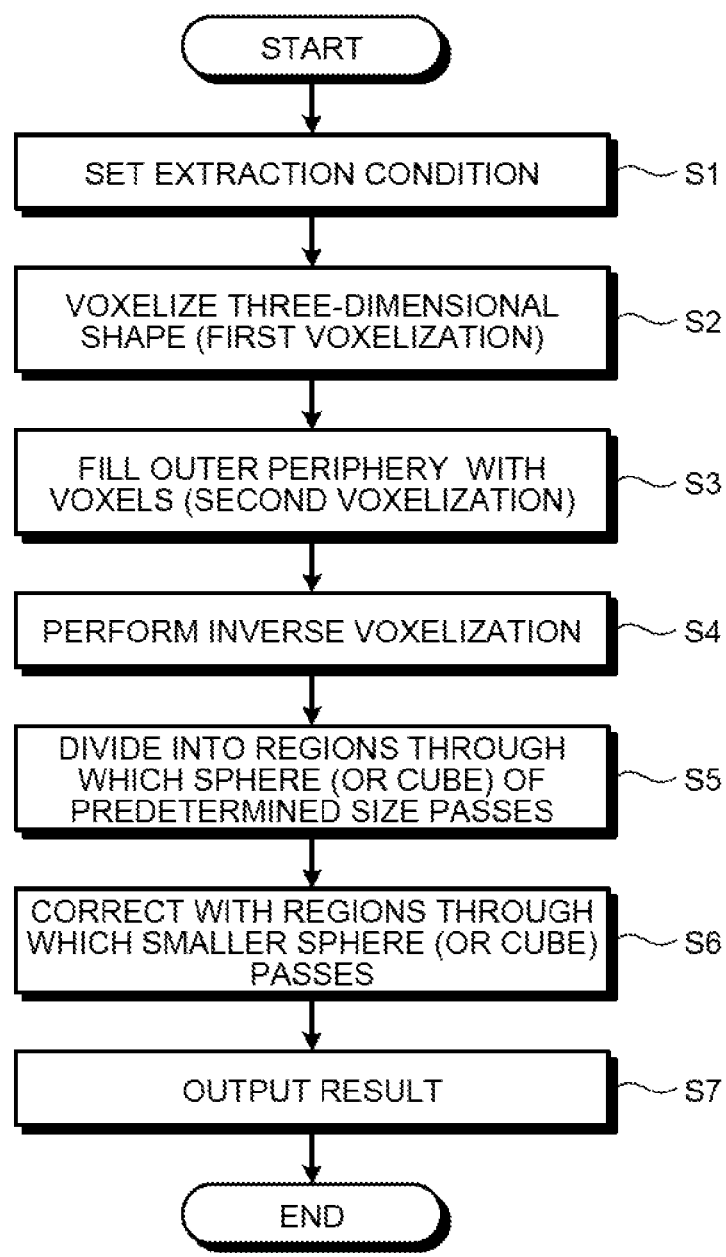
FIG. 2 is a flowchart illustrating an operation example of the information processing device according to the embodiment.

Details of processing performed by the information processing device 1 are described next. FIG. 2 is a flowchart illustrating an operation example of the information processing device 1 according to the embodiment.

As illustrated in FIG. 2, when processing is started, the setting unit 60 sets an extraction condition related to extraction of a free space in a product based on an operation of the user on a setting screen (S1).

Figure 3:
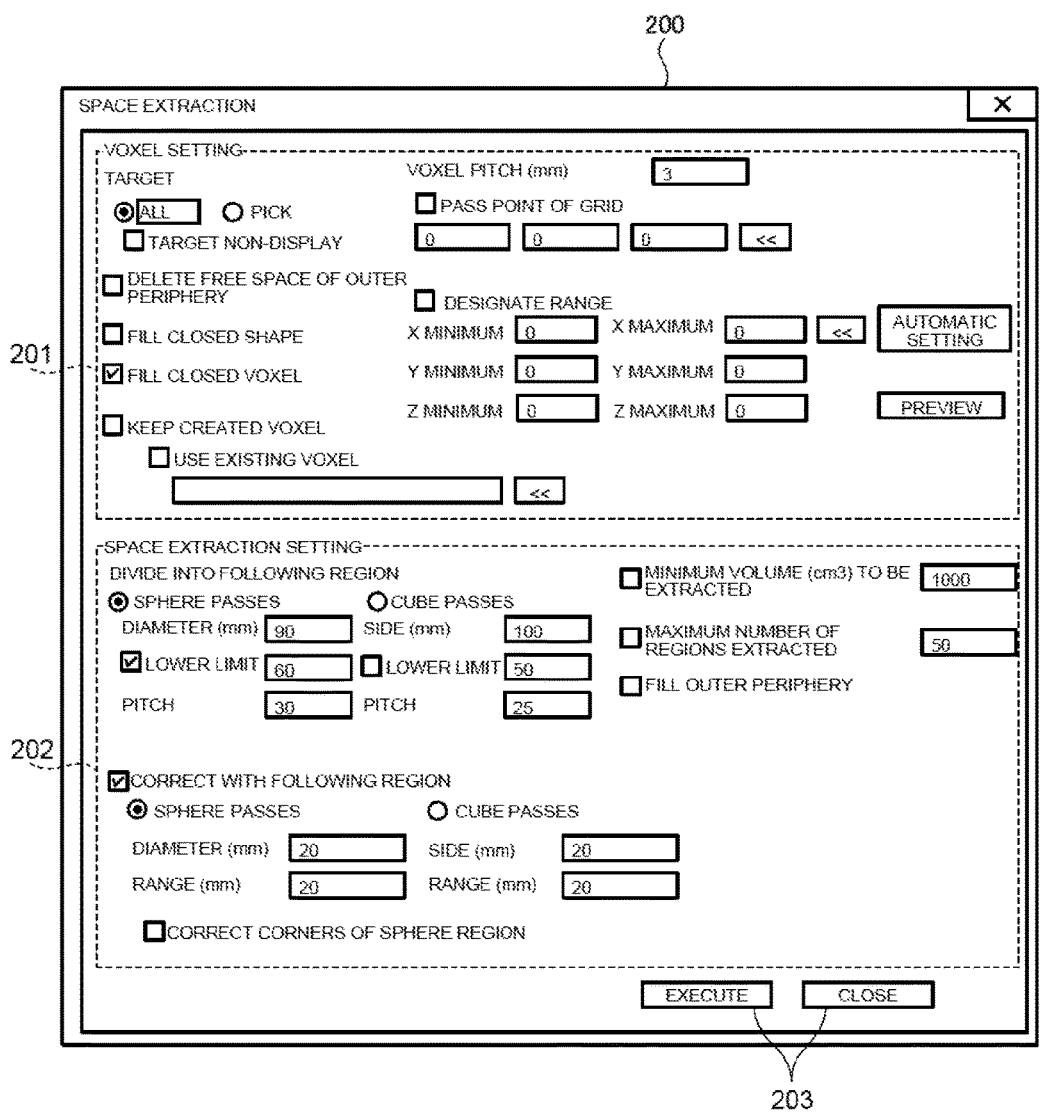
FIG. 3 is an explanatory diagram for explaining a setting screen.

FIG. 3 is an explanatory diagram for explaining a setting screen. As illustrated in FIG. 3, a setting screen 200 has setting regions 201 and 202, and various setting buttons 203.

The setting region 201 receives setting contents at the time of voxelization performed by the first voxelization unit 10, the second voxelization unit 20, and the inverse voxelization unit 30. Specifically, settings of a pitch and the like in the voxelization of the first voxelization unit 10, the second voxelization unit 20, and the inverse voxelization unit 30 are received in the setting region 201.

The setting region 202 receives setting contents at the time of region specification performed by the region specification unit 40. Specifically, settings such as a setting to select either a sphere or a cube to be used as a solid to specify the region, and a setting on the size of the selected solid are received in the setting region 202.

After S1, the first voxelization unit 10 voxelizes a three-dimensional shape of the product indicated by three-dimensional shape data of the product under the set extraction condition (first voxelization) (S2).

FIG. 4 is an explanatory diagram for explaining voxelization of a three-dimensional shape. As illustrated in FIG. 4, the first voxelization unit 10 voxelizes a three-dimensional shape 300 indicated by three-dimensional shape data and generates a voxel structure 301 corresponding to the three-dimensional shape 300. This voxelization is performed using a known algorithm, for example, setting a region through which each of triangles in a facet contained in the three-dimensional shape data passes to "1 (there is a voxel)".

Next, the second voxelization unit 20 performs second voxelization of filling a region outside the outer periphery of the voxel 301 generated by the first voxelization unit 10 with voxels (second voxel structure) (S3).

Figure 5:
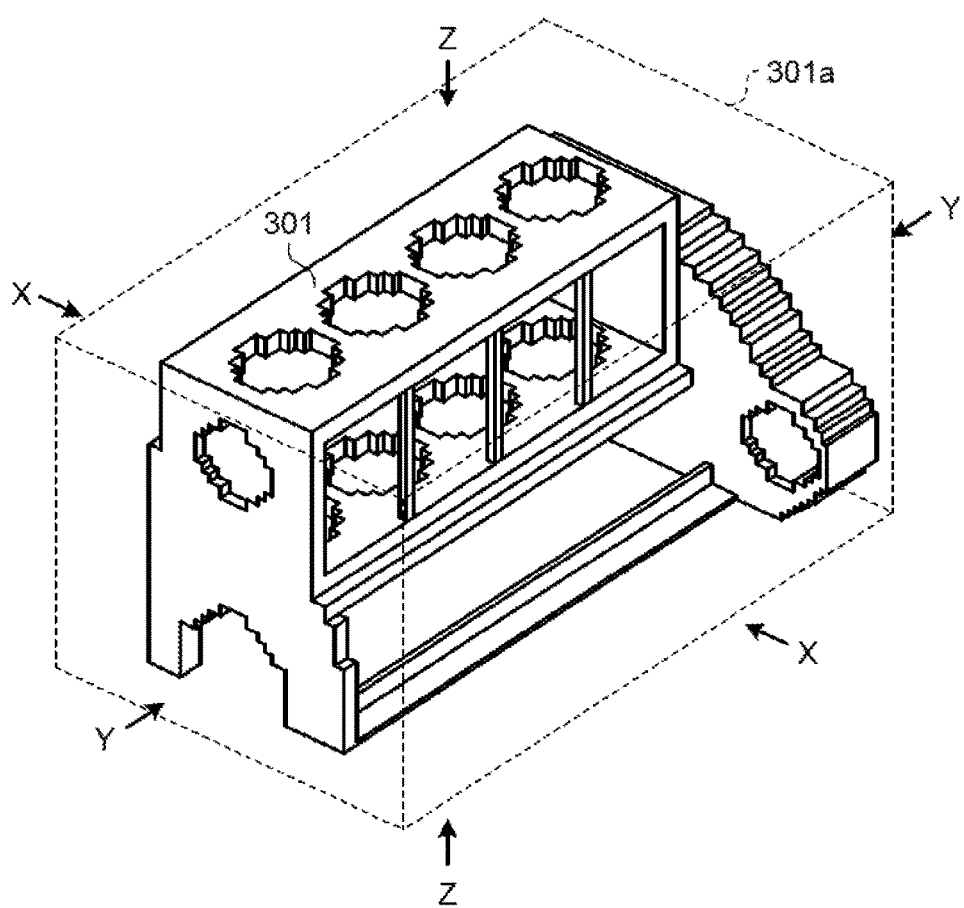
FIG. 5 is an explanatory diagram for explaining processing of filling an outer periphery with voxels.

FIG. 5 is an explanatory diagram for explaining processing of filling an outer periphery with voxels. As illustrated in FIG. 5, the second voxelization unit 20 extends lines toward inside of a solid 301a containing the voxel structure 301 generated by the first voxelization unit 10 until the lines hit the voxel structure 301. Next, the second voxelization unit 20 specifies a region outside the outer periphery of the voxel structure 301 generated by the first voxelization unit 10 according to whether at least lines extended from three faces orthogonal to each other intersect.

That is, the second voxelization unit 20 starts filling the outer periphery with voxels in X, Y, and Z directions toward the voxel structure 301 and specifies a common region filled with voxels in all the X, Y, and Z directions as the region outside the outer periphery of the voxel structure 301.

FIG. 6A is an explanatory diagram for explaining processing of filling an outer periphery in the X direction with voxels. As illustrated in FIG. 6A, the second voxelization unit 20 obtains a region 302a by filling the outer periphery with voxels in the X direction toward the voxel structure 301.

FIG. 6B is an explanatory diagram for explaining processing of filling an outer periphery in the Y direction with voxels. As illustrated in FIG. 6B, the second voxelization unit 20 obtains a region 302b by filling the outer periphery with voxels in the Y direction toward the voxel structure 301.

FIG. 6C is an explanatory diagram for explaining processing of filling an outer periphery in the Z direction with voxels. As illustrated in FIG. 6C, the second voxelization unit 20 obtains a region 302c by filling the outer periphery with voxels in the Z direction toward the voxel structure 301.

Figure 7:
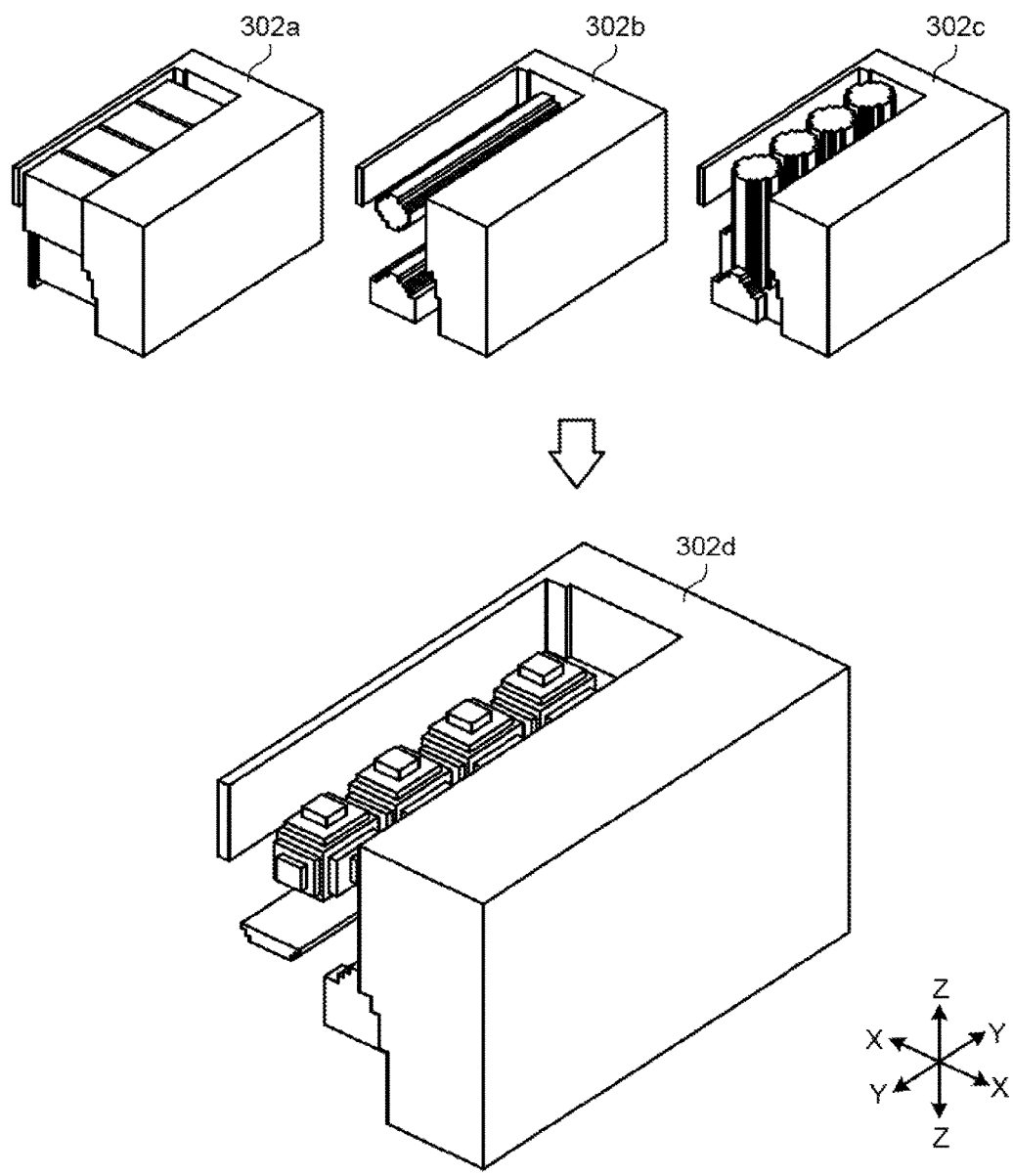
FIG. 7 is an explanatory diagram for explaining taking-out of a common region.

FIG. 7 is an explanatory diagram for explaining taking-out of a common region. As illustrated in FIG. 7, the second voxelization unit 20 takes out, from the obtained regions 302a, 302b, and 302c, a common region 302d common to the regions 302a, 302b, and 302c.

Figure 8:
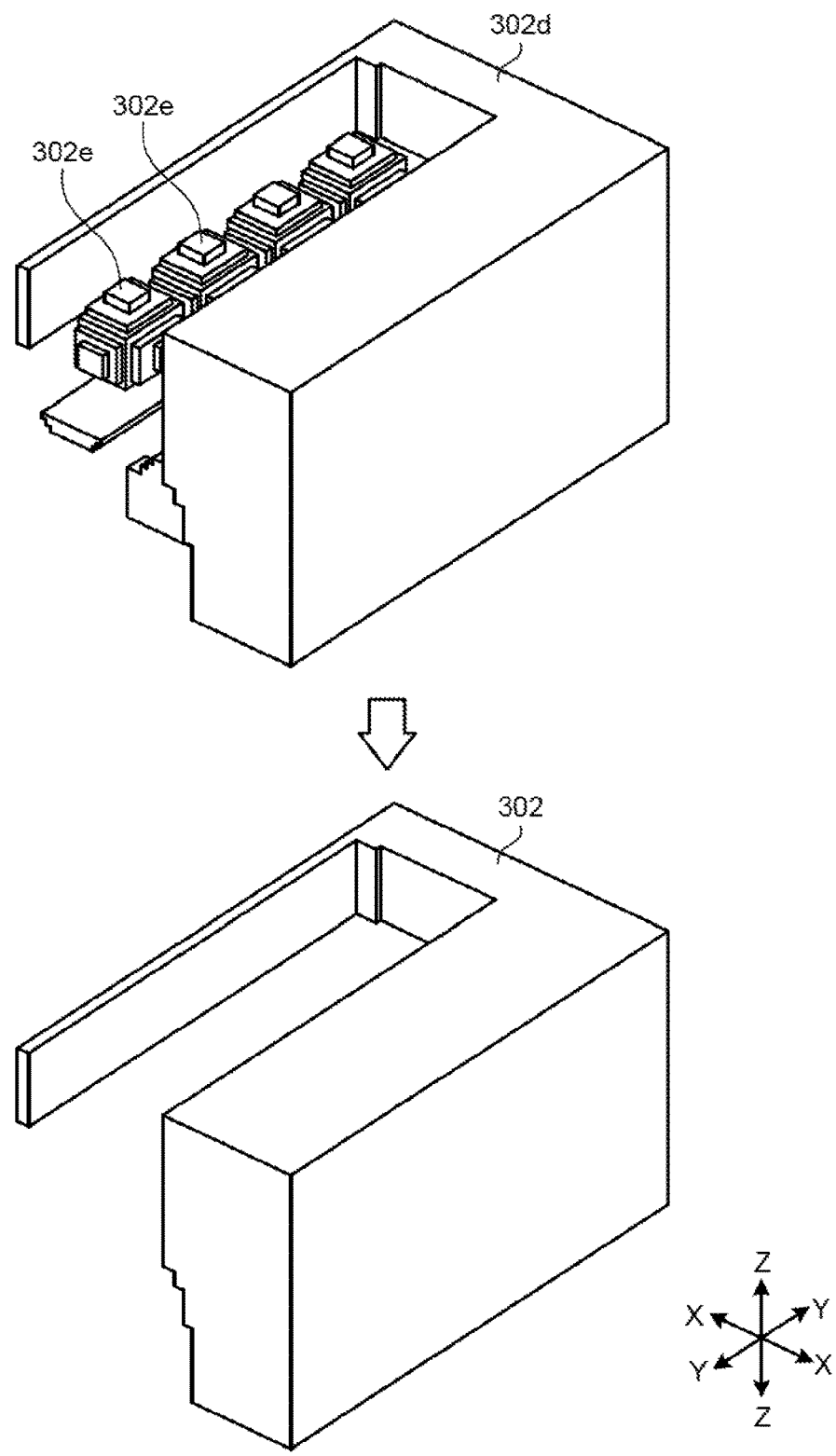
FIG. 8 is an explanatory diagram for explaining removal of hollow regions.

FIG. 8 is an explanatory diagram for explaining removal of hollow regions. There are cases where the common region 302d includes also hollow regions 302e that are located inside the voxel structure 301 as illustrated in FIG. 8. These hollow regions 302e are not in contact with the solid 301a. Therefore, the second voxelization unit 20 specifies a region that is at least partially in contact with the outer periphery of the solid 301a in the common region 302d and removes the hollow regions 302e. In this way, the second voxelization unit 20 specifies a common region 302 outside the outer periphery of the voxel structure 301.

Figure 9:
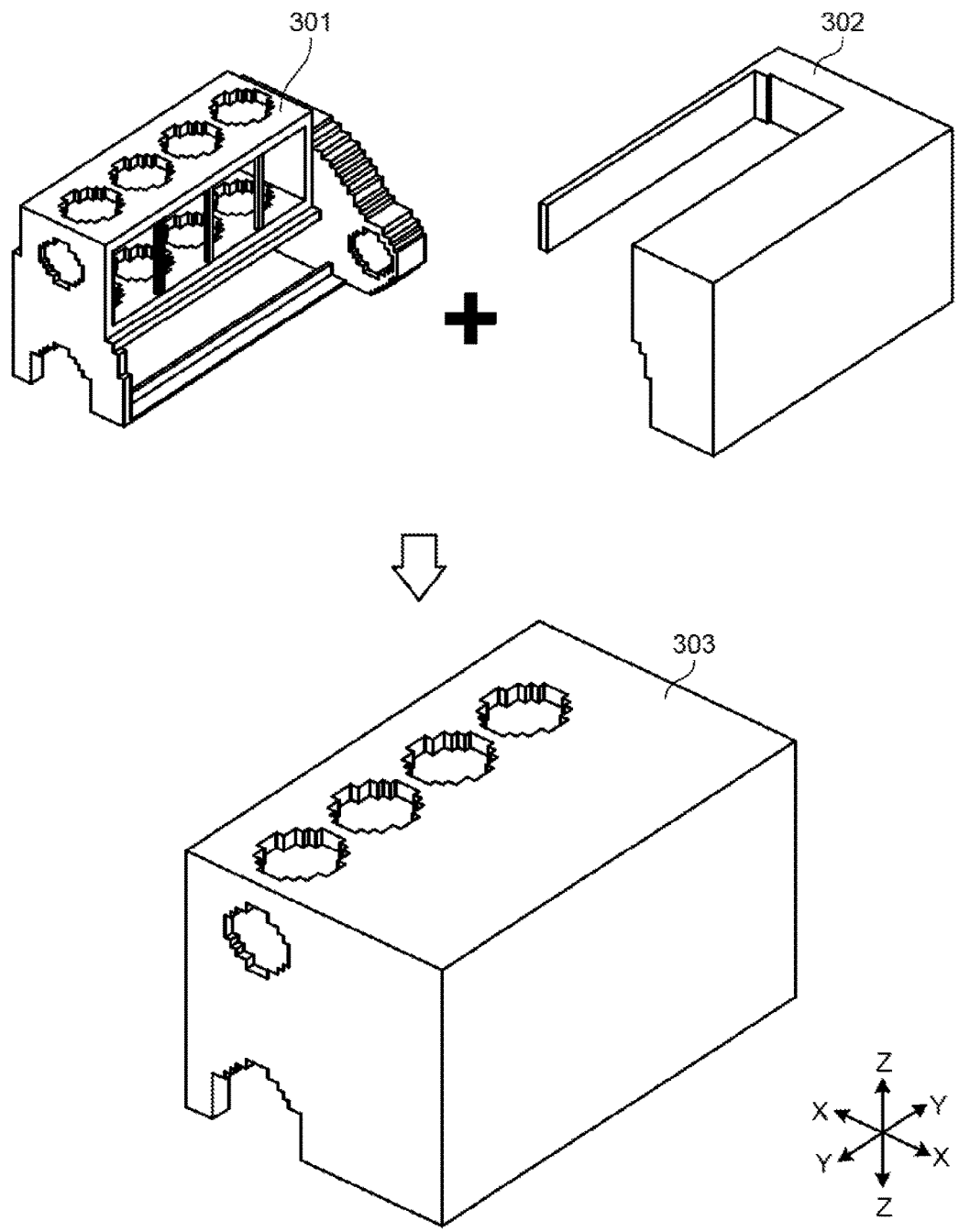
FIG. 9 is an explanatory diagram for explaining addition of obtained regions.

FIG. 9 is an explanatory diagram for explaining addition of obtained regions. As illustrated in FIG. 9, the second voxelization unit 20 adds together the voxel structure 301 and the obtained common region 302 to obtain a voxel structure 303 in which the outer periphery of the three-dimensional shape is filled with voxels.

After S3, the inverse voxelization unit 30 performs inverse voxelization on the voxel structure 303 (S4). FIG. 10 is an explanatory diagram for explaining inverse voxelization. As illustrated in FIG. 10, the inverse voxelization unit 30 inverts presence and absence of the voxel structure 303 in the solid 301a (performs inverse voxelization) to extract a voxel structure 304 corresponding to a free space in the three-dimensional shape.

Next, the region specification unit 40 specifies regions through which a sphere (or a cube) of a predetermined size set in the setting region 202 of the setting screen 200 passes in the voxel structure 304 resulting from the inverse voxelization. Next, the region specification unit 40 performs division of each of specified regions in the voxel structure 304 resulting from the inverse voxelization (S5). With this division, the region specification unit 40 specifies one or more division regions from the voxel structure 304.

Figure 11:
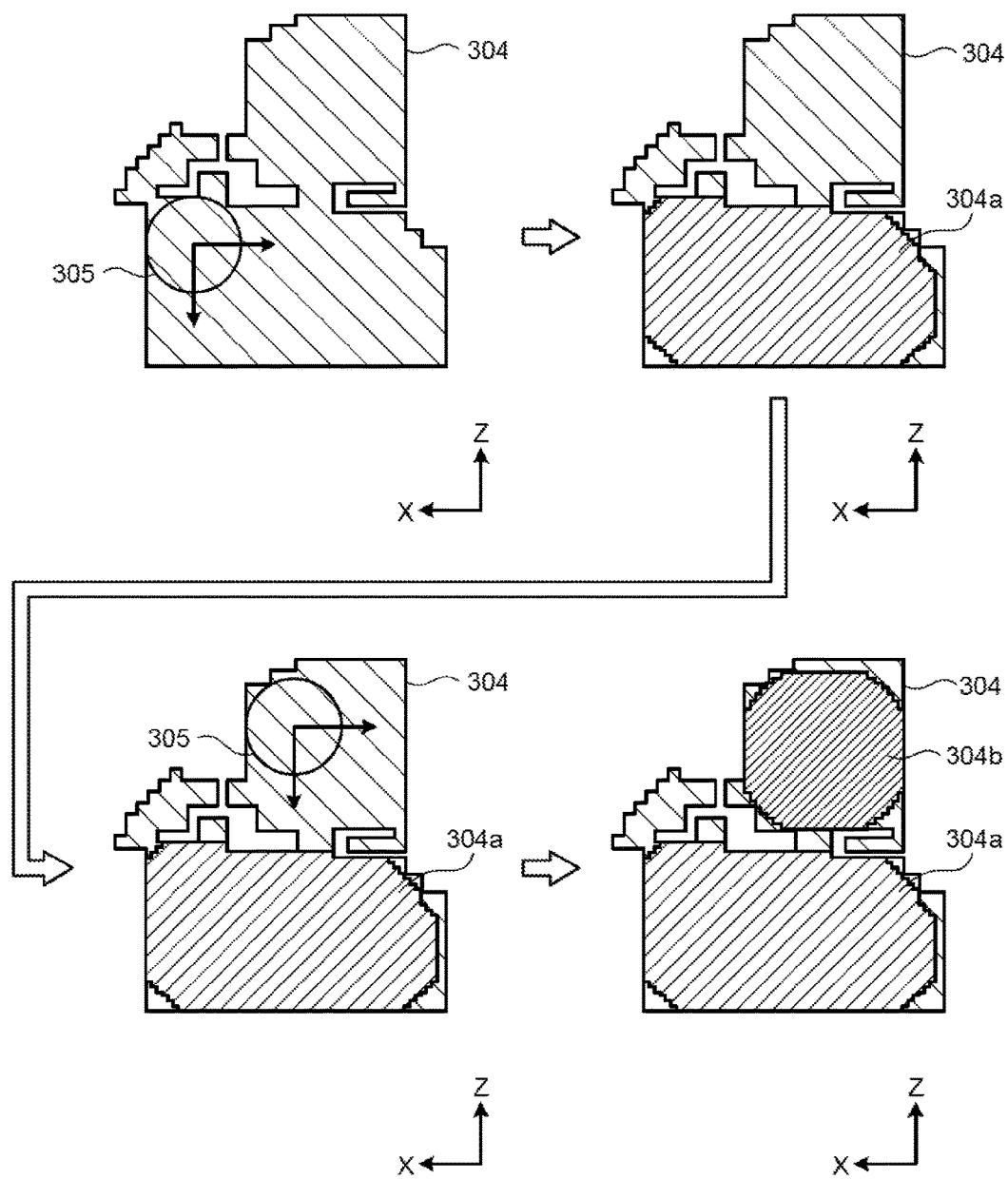
FIG. 11 is an explanatory diagram for explaining specification of division regions.
Figure 12:
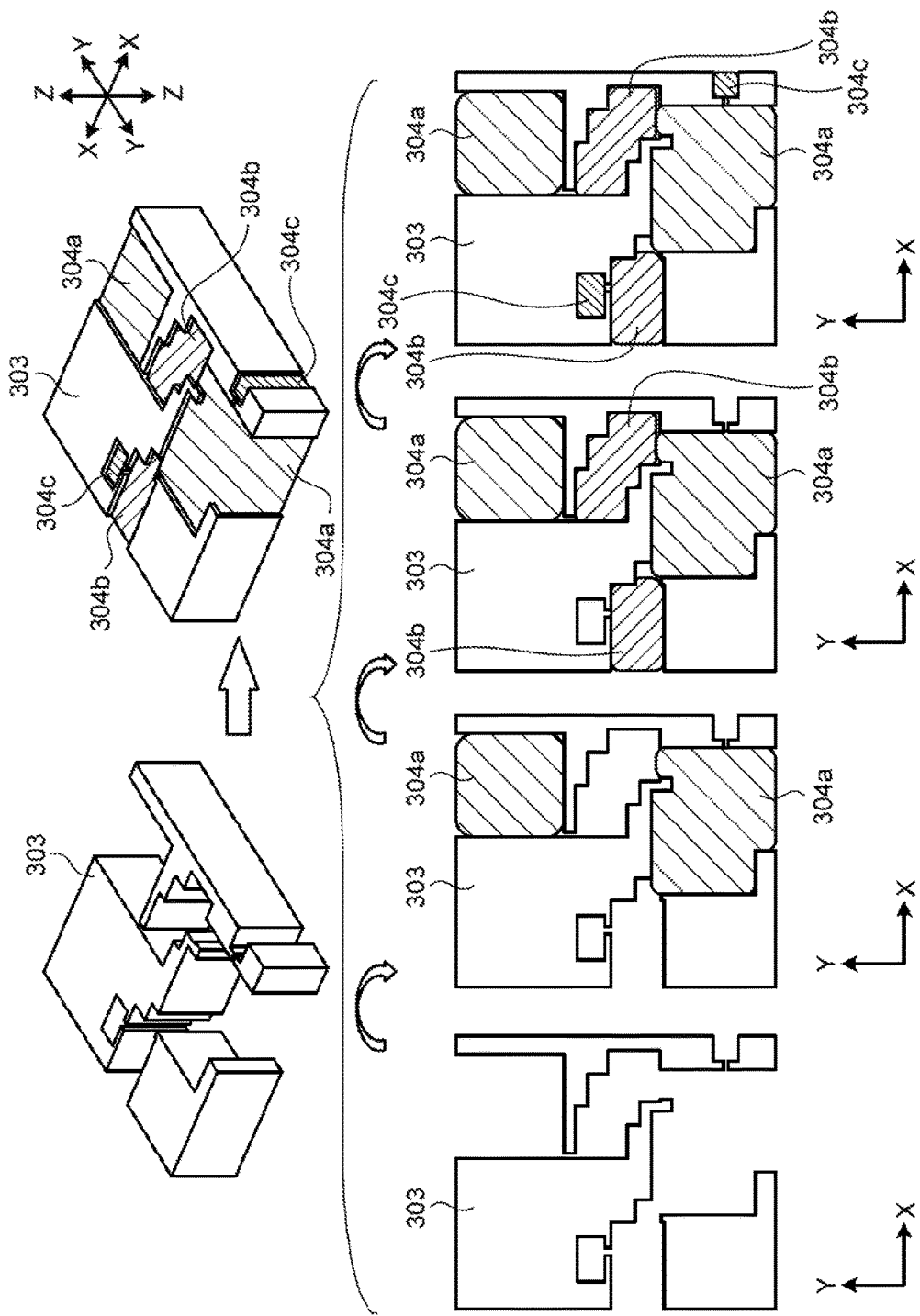
FIG. 12 is an explanatory diagram for explaining specification of division regions.

FIGS. 11 and 12 are explanatory diagrams for explaining specification of division regions. As illustrated in FIG. 11, the region specification unit 40 continuously moves a sphere 305 in the voxel structure 304 to specify a division region 304a through which the sphere 305 can pass. Next, the region specification unit 40 continuously moves the sphere 305 in a region other than the division region 304a in the voxel structure 304 to specify a division region 304b through which the sphere 305 can pass.

Further, as illustrated in FIG. 12, the region specification unit 40 can specify division regions using the sphere 305 with the diameter reduced in a stepwise manner. As an example, the region specification unit 40 first specifies division regions 304a through which the sphere 305 with a diameter of 60 millimeters passes. Next, the region specification unit 40 specifies division regions 304b through which the sphere 305 with a diameter of 40 millimeters passes. Subsequently, the region specification unit 40 specifies division regions 304c through which the sphere 305 with a diameter of 20 millimeters passes. In this way, using the sphere 305 with the dimeter reduced in a stepwise manner, smaller division regions can be specified in a stepwise manner.

Figure 13:
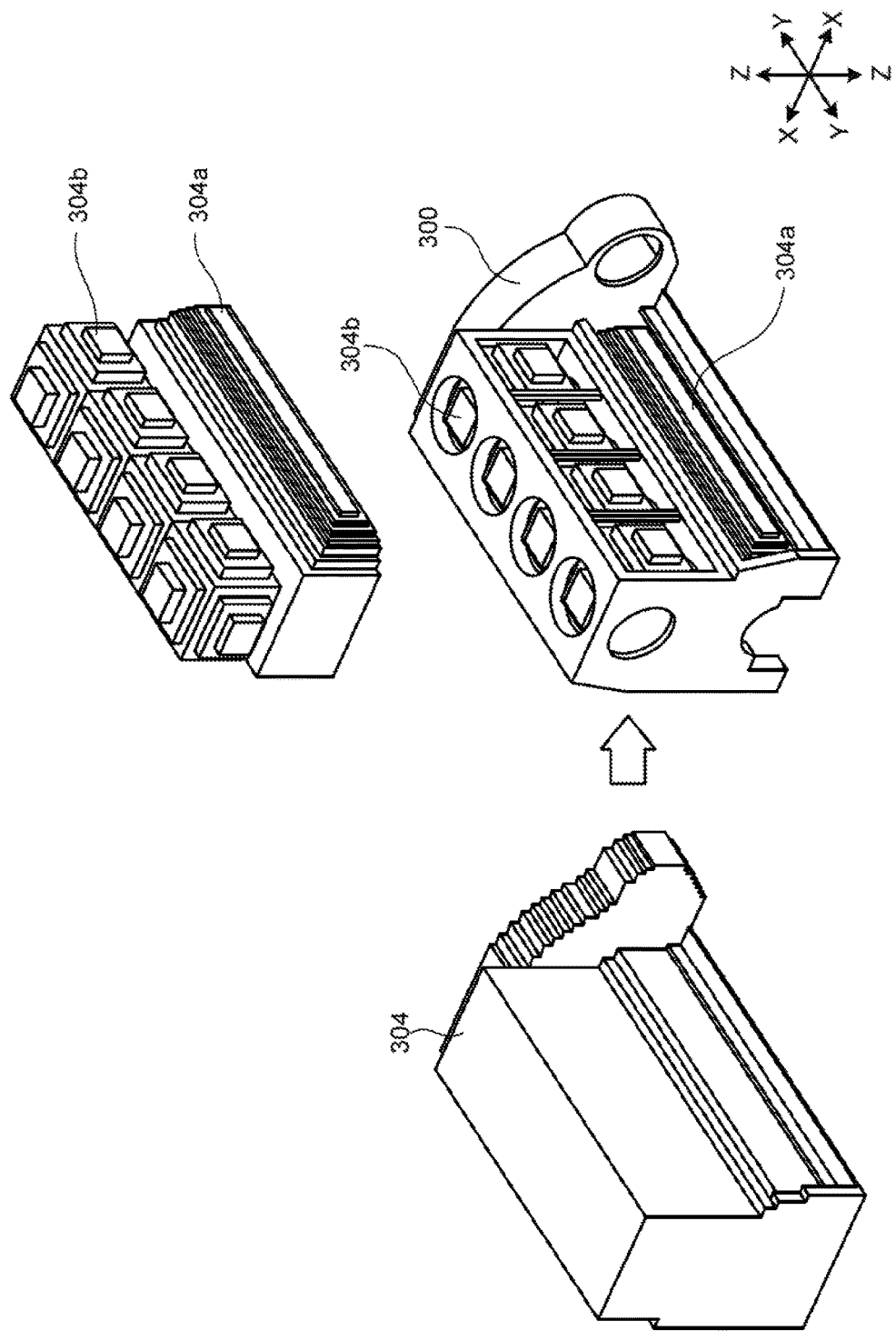
FIG. 13 is an explanatory diagram for explaining extracted regions.

FIG. 13 is an explanatory diagram for explaining extracted regions. As illustrated in FIG. 13, two regions (rooms) connected with a predetermined clearance in the voxel structure 304 corresponding to the free space in the three-dimensional shape are divided by the region specification unit 40 into the division regions 304a and 304b and extracted.

The extracted division regions 304a and 304b have rough shapes depending on the size of the sphere 305. Therefore, in processing subsequent to S5, the region specification unit 40 corrects each of the division regions 304a and 304b with a region through which a sphere (or a cube) smaller than the sphere 305 continuously passes in the outer periphery (S6).

Figure 14:
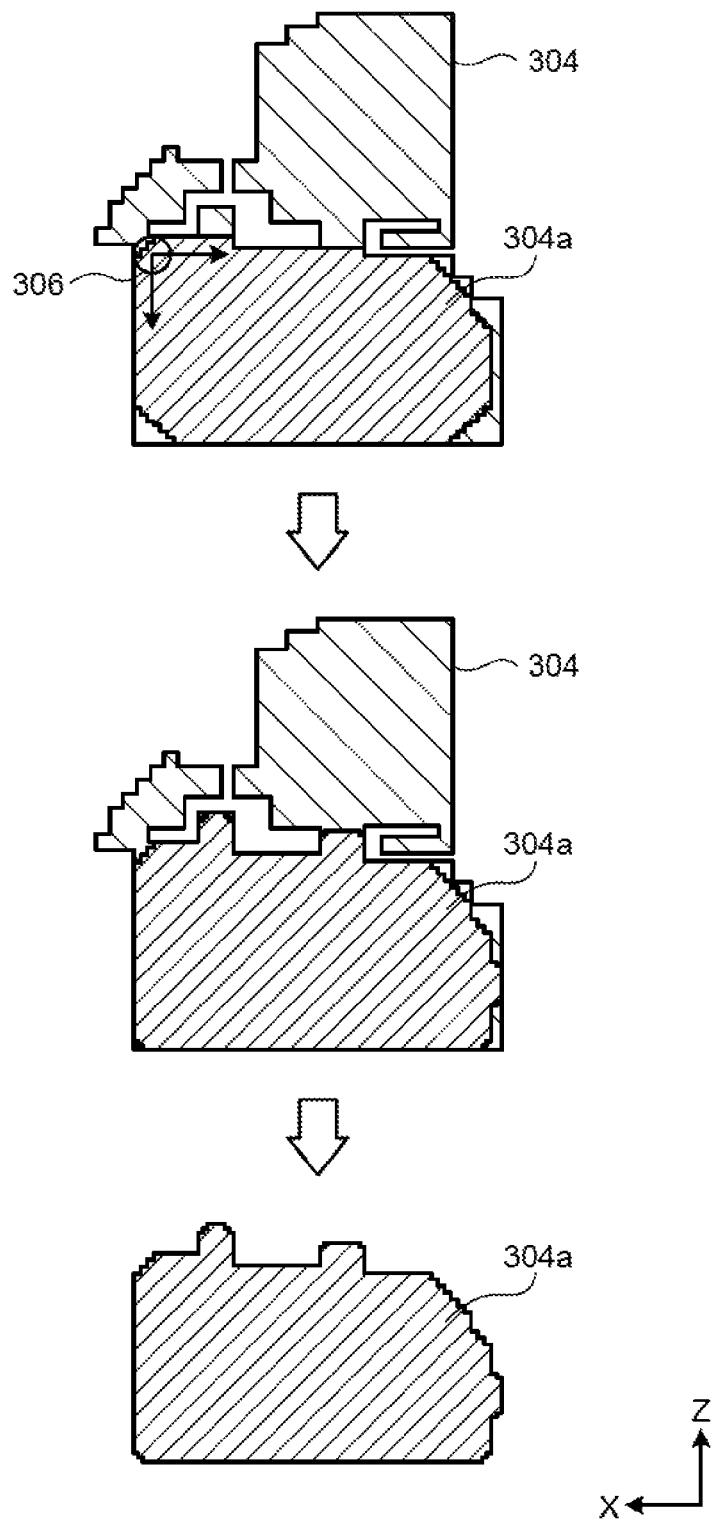
FIG. 14 is an explanatory diagram for explaining correction with a smaller sphere.

FIG. 14 is an explanatory diagram for explaining correction with a smaller sphere. As illustrated in FIG. 14, the region specification unit 40 corrects the division region 304a with a region through which a sphere 306 smaller than the sphere 305 passes in the outer periphery of the division region 304a. The region specification unit 40 also corrects the division region 304b in a similar manner.

Figure 15:
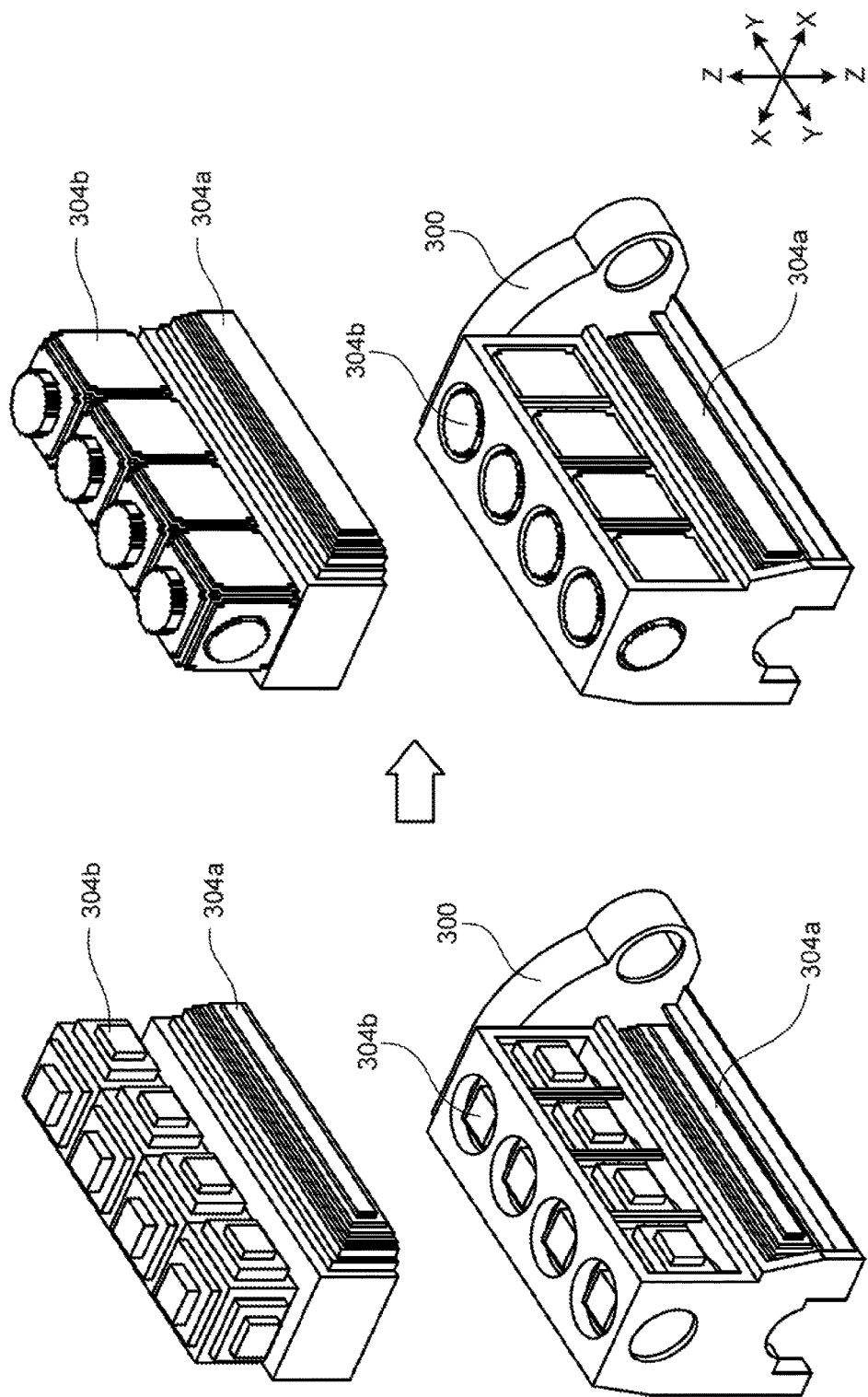
FIG. 15 is an explanatory diagram for explaining corrected regions.
Figure 16:
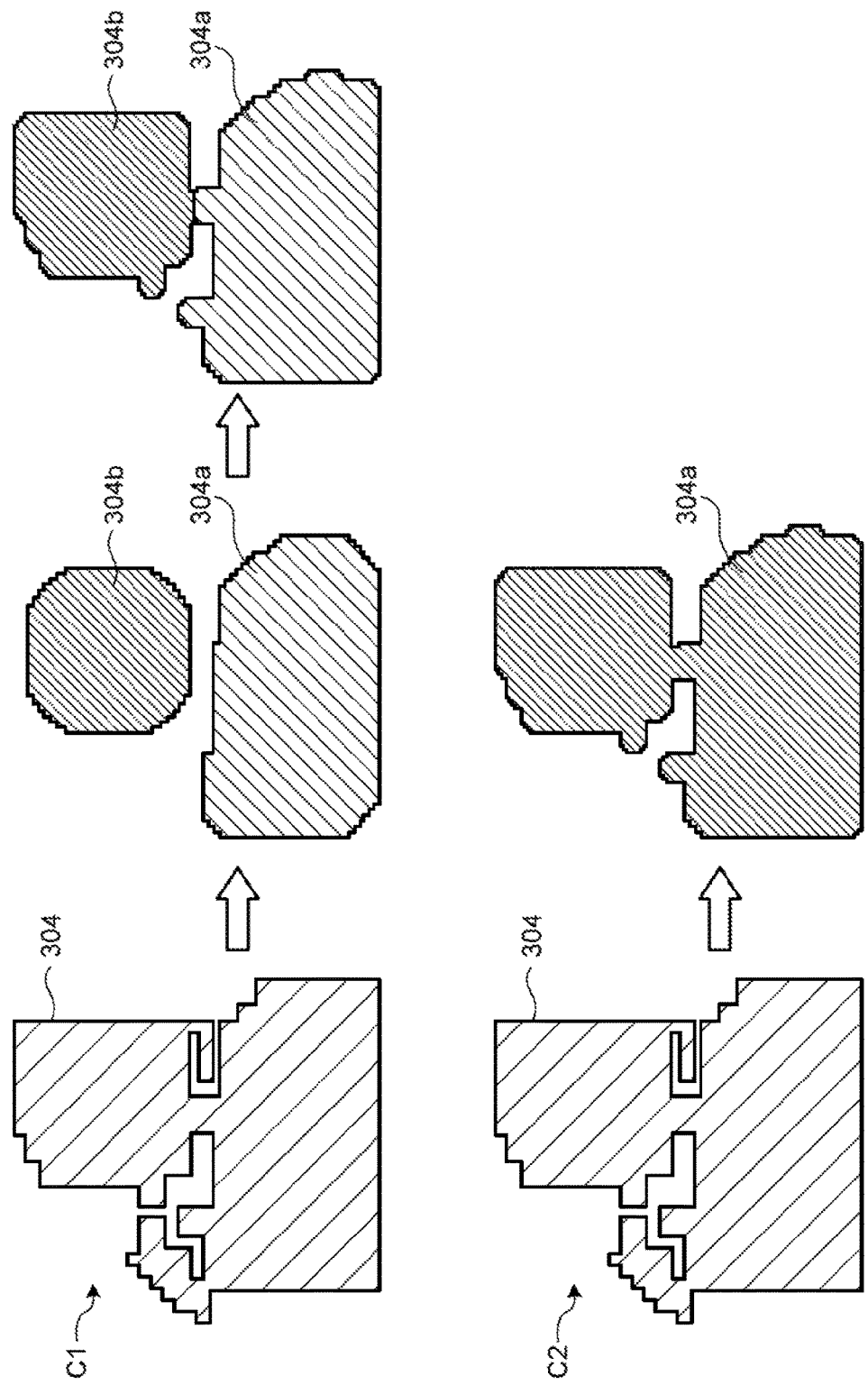
FIG. 16 is an explanatory diagram for explaining corrected regions.

FIGS. 15 and 16 are explanatory diagrams for explaining corrected regions. As illustrated in FIG. 15, the shapes of the division regions 304a and 304b can be made finer with the correction at S6.

In FIG. 16, a case C1 indicates a case where the division regions 304a and 304b through which the sphere 305 can passes in the voxel structure 304 are specified and thereafter the regions are corrected with the sphere 306 smaller than the sphere 305. A case C2 indicates a case where division regions are specified using the sphere 306 smaller than the sphere 305 from the beginning. As indicated by the case C2, when specification of division regions is performed using the sphere 306 from the beginning, one continuous division region 304a is specified. In contrast thereto, in the case C1, because specification of division regions is first performed using the larger sphere 305 and thereafter the division regions are corrected using the smaller sphere 306, the two division regions 304a and 304b can be specified and then the shapes of the division regions 304a and 304b can be corrected finely.

Referring back to FIG. 2, after S6, the output unit 50 outputs a processing result until S6 (S7). Specifically, the output unit 50 outputs the voxel structure corresponding to the free space (the division regions 304a, 304b, and the like) in the three-dimensional shape indicated by the three-dimensional shape data to a display screen or the like.

Figure 17:
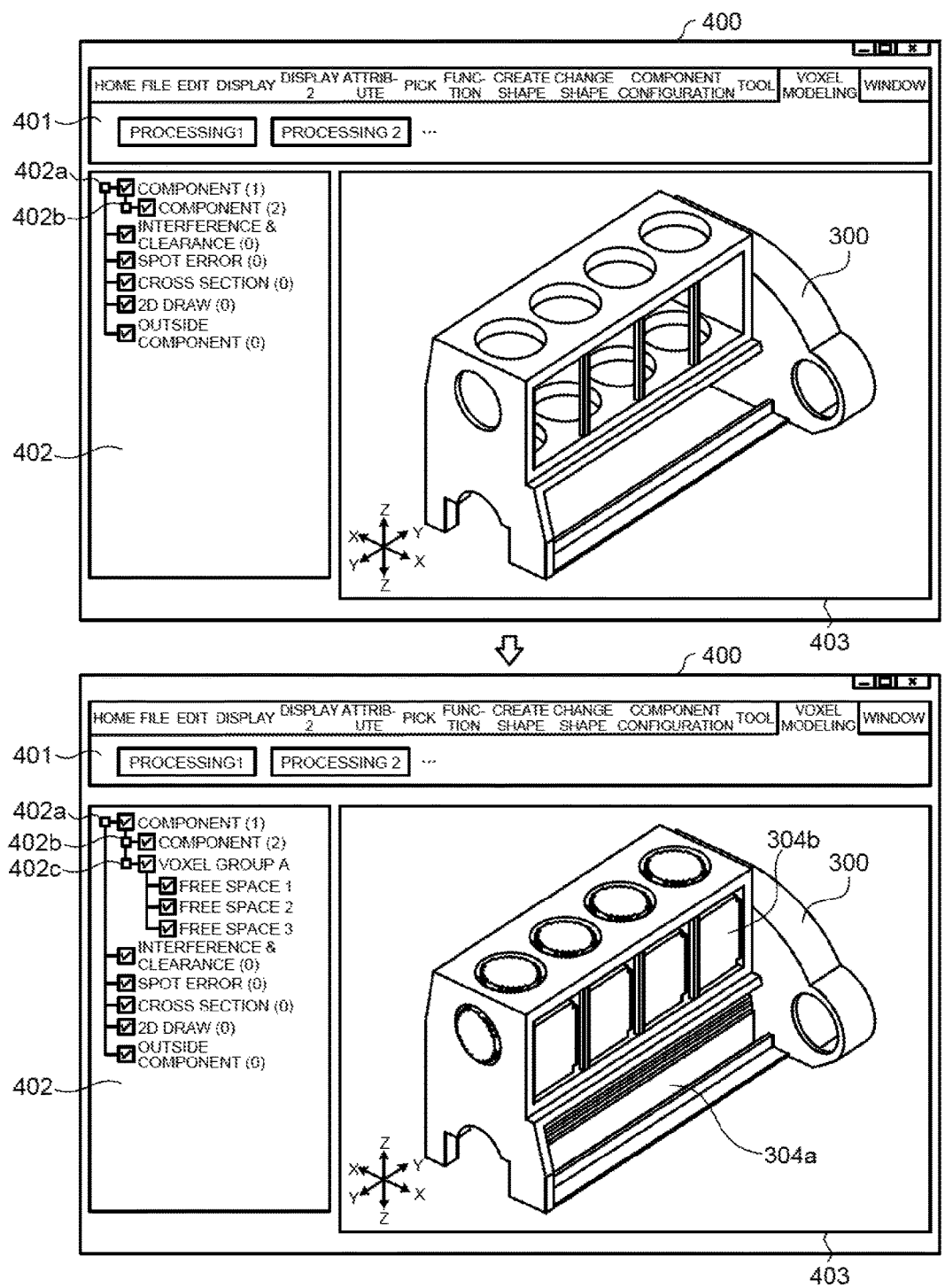
FIG. 17 is an explanatory diagram for explaining a display screen.
Figure 18:
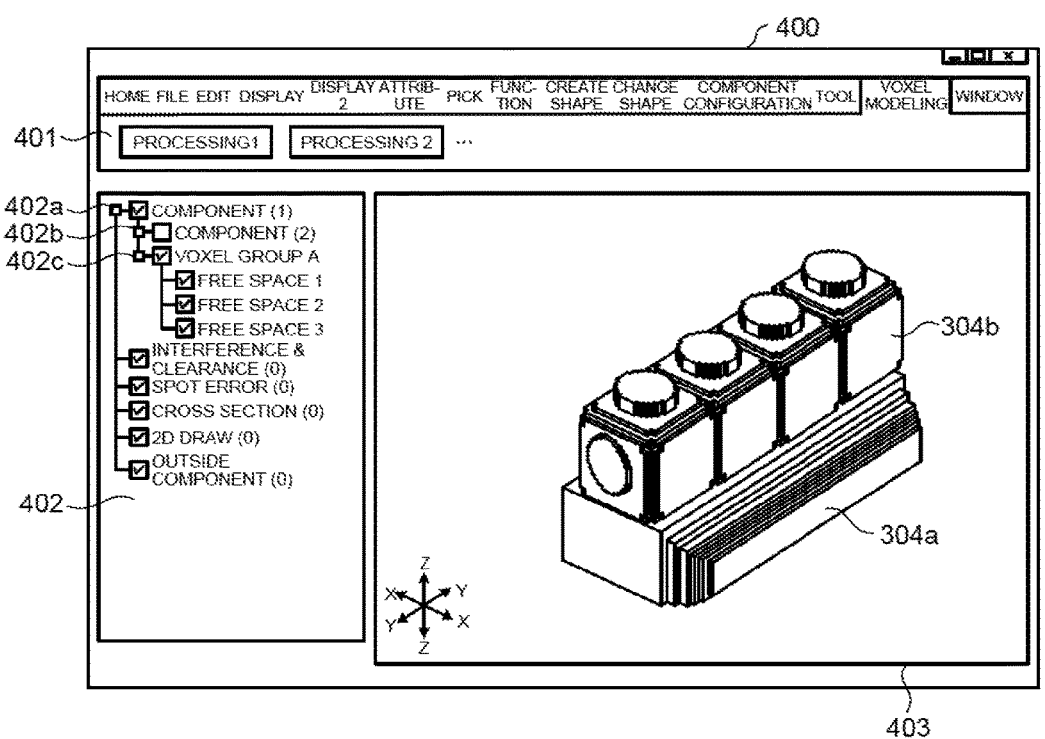
FIG. 18 is an explanatory diagram for explaining a display screen.

FIGS. 17 and 18 are explanatory diagrams for explaining a display screen. As illustrated in FIG. 17, a display screen 400 has an operation region 401, a tree display region 402, and a three-dimensional-shape display region 403.

The operation region 401 is a region having various operation buttons and receives an operation instruction from a user. The tree display region 402 is a region in which display members to be displayed in the three-dimensional-shape display region 403 are displayed in a tree format. On a tree 402a in the tree display region 402, a branch 402b is set with respect to each of the display members to be displayed in the three-dimensional-shape display region 403. The user can instruct whether to display/undisplay the display members in the three-dimensional-shape display region 403 by checking/unchecking a checkbox of the branch 402b.

At S7, the voxel structure corresponding to the free space (the division regions 304a and 304b) in the three-dimensional shape 300 indicated by the three-dimensional shape data is displayed in the three-dimensional-shape display region 403. This enables the user to confirm the free space in the three-dimensional shape 300 indicated by the three-dimensional shape data with the voxel structure. Furthermore, the user can switch display of the three-dimensional shape 300 and the voxel structure by checking/unchecking checkboxes of the branch 402b and a branch 402c in the tree display region 402.

Specifically, the three-dimensional shape 300 can be cleared and the voxel structure can be displayed by checking the checkbox of the branch 402c and unchecking the checkbox of the branch 402b as illustrated in FIG. 18.

As described above, the information processing device 1 voxelizes a three-dimensional shape to generate a first voxel structure corresponding to the three-dimensional shape, specifies a region outside the outer periphery of the first voxel structure, and sets the specified outside region as a second voxel structure. The information processing device 1 then performs inversion (inverse voxelization) of inverting the region set as voxel structures and a region not set as a voxel, and specifies a shape (voxel structure) corresponding to a free space in the three-dimensional shape. Because the information processing device 1 thus specifies the shape corresponding to a free space in a three-dimensional shape using a voxel structure that can simply represent the three-dimensional shape, a processing load associated with various types of computing can be suppressed as compared to a case of using three-dimensional shape data such as a BREP or a facet, and the free space can be easily extracted.

It is not always needed that respective constituent elements of the respective devices illustrated in the drawings are configured physically the same as those illustrated in the drawings. That is, specific modes of dispersion and integration of the respective devices are not limited to those illustrated in the drawings, and a part or whole of the devices can be configured while being functionally or physically dispersed or integrated in an arbitrary unit according to various types of load and status of use.

Among various processing functions performed by the information processing device 1, all or an arbitrary part thereof can be performed on a central processing unit (CPU) (or on a microcomputer such as a micro processing unit (MPU) or a micro control unit (MCU)). It goes without saying that all or an arbitrary part of the various processing functions can be performed on a program analyzed and executed by a CPU (or a microcomputer such as an MPU or an MCU) or on hardware using wired logic. The processing functions performed by the information processing device 1 can be performed by cloud computing in cooperation of a plurality of computers.

Figure 19:
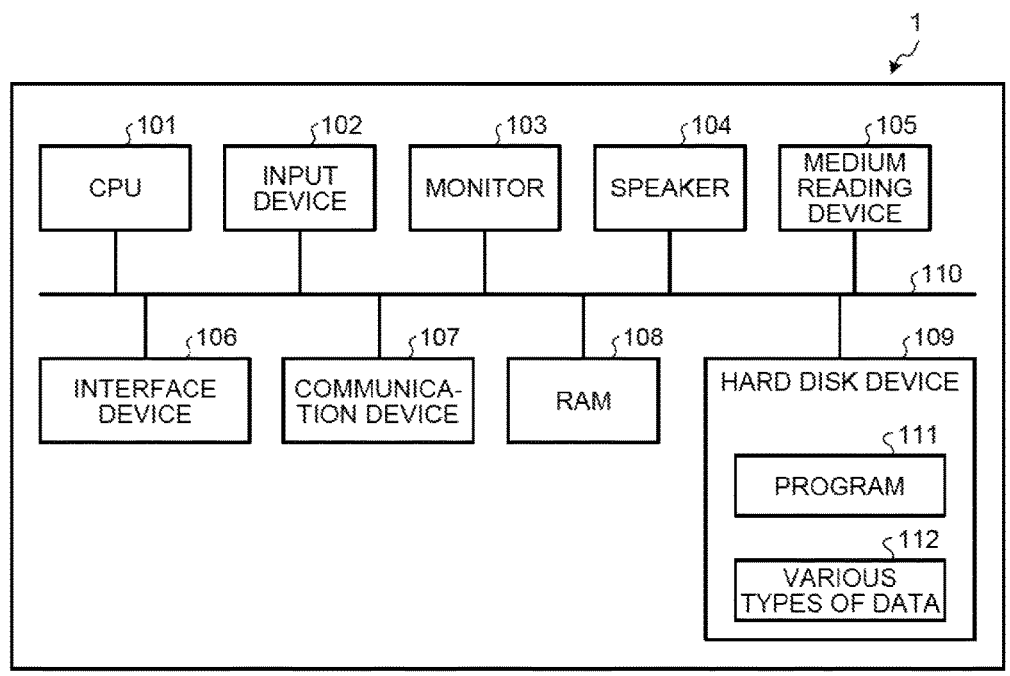
FIG. 19 is a block diagram illustrating a hardware configuration example of the information processing device according to the embodiment.

The various types of processing described in the above embodiment can be realized by executing a program prepared in advance on a computer. An example of the computer (hardware) that executes a program having similar functions as those in the embodiment described above is described below. FIG. 19 is a block diagram illustrating a hardware configuration example of the information processing device 1 according to the present embodiment.

As illustrated in FIG. 19, the information processing device 1 has a CPU 101 that performs various types of computing processing, an input device 102 that receives data inputs, a monitor 103, and a speaker 104. The information processing device 1 also has a medium reading device 105 that reads a program and the like from a storage medium, an interface device 106 for connecting to various devices, and a communication device 107 for communicating and connecting to external devices wiredly or wirelessly. The information processing device 1 further has a RAM 108 that temporarily stores therein various types of information, and a hard disk device 109. The respective components (101 to 109) in the information processing device 1 are connected to a bus 110.

A program 111 for performing the various types of processing in the first voxelization unit 10, the second voxelization unit 20, the inverse voxelization unit 30, the region specification unit 40, the output unit 50, and the setting unit 60 described in the above embodiment is stored in the hard disk device 109. Various types of data 112 (the three-dimensional shape data, for example) that is referred to by the program 111 is also stored in the hard disk device 109. The input device 102 receives inputs of operation information from an operator of the information processing device 1, for example. The monitor 103 displays various screens (such as the setting screen 200 and the display screen 400) to be operated by the operator, for example. For example, a printing device is connected to the interface device 106. The communication device 107 is connected to a communication network such as a local area network (LAN) and exchanges various types of information with external devices via the communication network.

The CPU 101 performs various types of processing by reading the program 111 stored in the hard disk device 109 and loading and executing the program 111 in the RAM 108. The program 111 does not need to be stored in the hard disk device 109. For example, it is possible to configure that the information processing device 1 reads the program 111 stored in a readable storage medium and executes the program 111. The readable storage medium read by the information processing device 1 corresponds to, for example, a portable recording medium such as a CD-ROM, a DVD disk, or a Universal Serial Bus (USB) memory, a semiconductor memory such as a flash memory, and a hard disk drive. It is also possible to configure that the program 111 is stored in a device being connected to a public line, the Internet, a LAN, and the like and the information processing device 1 reads the program 111 from such a device to execute the program 111.

According to an embodiment of the present invention, extraction of a free space from a three-dimensional shape can be easily performed.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium storing a voxelization program that causes a computer to execute a process for extracting a free space in a product based on three-dimensional shape data of the product, the three-dimensional shape data being created by a three-dimensional CAD (Computer Aided Design) and received by the computer, the process comprising:

voxelizing the three-dimensional shape data to generate a first voxel structure corresponding to the three-dimensional shape data;

specifying, in a case where lines perpendicular to respective faces of a cube or a cuboid containing the generated first voxel structure are extended from the respective faces toward inside the cube or the cuboid until the lines hit the first voxel structure, a region outside an outer periphery of the first voxel structure according to whether at least lines extended from three faces orthogonal to each other intersect;

setting the specified region as a second voxel structure, and obtaining a third voxel structure by adding the first voxel structure and the second voxel structure; and performing an inversion where, in the third voxel structure obtained, a region set as a voxel structure is set as a non-voxel structure and a region not set as a voxel structure is set as a fourth voxel structure, and specifying first regions as a fifth voxel structure through which a sphere or cube of a specific size is allowed to continuously pass in a region set as the fourth voxel structure resulting from the inversion, the fifth voxel structure corresponding to the free space.

2. The non-transitory computer-readable recording medium according to claim 1, wherein the specifying the first regions includes specifying further second regions through which a sphere or cube smaller than the sphere or cube of the specific size is allowed to continuously pass in an outer periphery of the first regions, the second regions corresponding to the free space.

3. A method, executed by a processor, for extracting a free space in a product based on three-dimensional shape data of the product, the three-dimensional shape data being created by a three-dimensional CAD (Computer Aided Design) and stored in a storage unit, the method comprising:

voxelizing the three-dimensional shape data to generate a first voxel structure corresponding to the three-dimensional shape data;

specifying, in a region of a specific three-dimensional space containing the generated first voxel structure regions in which no voxel is set continuously from an outer periphery of the region of the specific three-dimensional space respectively in three axis directions and specifying a common region common to the specified regions;

setting the specified common region as a second voxel structure; and performing an inversion where, in a voxel structure made by adding the first voxel structure and the second voxel structure, a region set as a voxel structure is set as a non-voxel structure and a region not set as a voxel structure is set as a third voxel structure, and specifying first regions as a fourth voxel structure through which a sphere or cube of a specific size is allowed to continuously pass in a region set as the third voxel structure resulting from the inversion, the fourth voxel structure corresponding to the free space.

4. The method according to claim 3, wherein at least a part of the common region is in contact with the outer periphery of the region of the specific three-dimensional space.

5. An information processing device comprising:

a processor that executes a process for extracting a free space in a product based on three-dimensional shape data of the product, the three-dimensional shape data being created by a three-dimensional CAD (Computer Aided Design) and received by the information processing device, the process including:

voxelizing the three-dimensional shape data to generate a first voxel structure corresponding to the three-dimensional shape data;

specifying, in a case where lines perpendicular to respective faces of a cube or a cuboid containing the generated first voxel structure are extended from the respective faces toward inside the cube or the cuboid until the lines hit the first voxel structure, a region outside an outer periphery of the first voxel structure according to whether at least lines extended from three faces orthogonal to each other intersect;

setting the specified region as a second voxel structure, and obtaining a third voxel structure by adding the first voxel structure and the second voxel structure; and performing an inversion where, in the third voxel structure obtained, a region set as a voxel structure is set as a non-voxel structure and a region not set as a voxel structure is set as a fourth voxel structure, and specifying first regions as a fifth voxel structure through which a sphere or cube of a specific size is allowed to continuously pass in a region set as the fourth voxel structure resulting from the inversion, the fifth voxel structure corresponding to the free space.

6. The information processing device according to claim 5, wherein the specifying the first regions includes specifying further second regions through which a sphere or cube smaller than the sphere or cube of the specific size is allowed to continuously pass in an outer periphery of the first regions, the second regions corresponding to the free space.

\* \* \* \* \*